(12) United States Patent
Yamakawa

(10) Patent No.: US 9,648,756 B2
(45) Date of Patent: May 9, 2017

(54) APPLYING APPARATUS

(71) Applicant: FUJITSU TEN LIMITED, Kobe-shi, Hyogo (JP)

(72) Inventor: Tomohiro Yamakawa, Fukuyama (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 62 days.

(21) Appl. No.: 14/819,979

(22) Filed: Aug. 6, 2015

(65) Prior Publication Data
US 2016/0059170 A1 Mar. 3, 2016

(30) Foreign Application Priority Data

Aug. 29, 2014 (JP) .................................. 2014-174967

(51) Int. Cl.
| | | |
|---|---|---|
| *B41F 15/40* | (2006.01) | |
| *B05B 9/04* | (2006.01) | |
| *A47L 9/20* | (2006.01) | |
| *H05K 3/34* | (2006.01) | |
| *H05K 13/04* | (2006.01) | |
| *B23K 3/08* | (2006.01) | |
| *B23K 1/00* | (2006.01) | |

(Continued)

(52) U.S. Cl.
CPC ........... *H05K 3/3457* (2013.01); *B23K 1/008* (2013.01); *B23K 1/0016* (2013.01); *B23K 1/203* (2013.01); *B23K 3/082* (2013.01); *H05K 3/3489* (2013.01); *H05K 13/0465* (2013.01); *B23K 2201/42* (2013.01); *H05K 2203/0126* (2013.01); *H05K 2203/081* (2013.01); *H05K 2203/1581* (2013.01)

(58) Field of Classification Search
CPC . B05C 11/1013; B01D 19/0068; B41F 15/40; B05B 9/04; B05B 13/041; H01L 21/67051; B23K 1/203; A47L 9/20

USPC .......... 55/385.1; 95/30; 118/302; 427/8, 401; 438/98, 778
See application file for complete search history.

(56) References Cited

U.S. PATENT DOCUMENTS 5,065,692 A * 11/1991 Hollesen ............... B05B 13/041
                                                 118/302
8,136,477 B2 * 3/2012 Cho ..................... B05C 11/1013
                                                 118/302

(Continued)

FOREIGN PATENT DOCUMENTS

| JP | 1995-019659 Y | 5/1995 |
|---|---|---|
| JP | 2001-300358 A | 10/2001 |

*Primary Examiner* — Jacob T Minskey
*Assistant Examiner* — Minh-Chau Pham
(74) *Attorney, Agent, or Firm* — Oliff PLC

(57) ABSTRACT

An applying apparatus that applies a flux liquid includes: a nozzle from which the flux liquid is injected; and an intake and exhaust unit that sucks the flux liquid injected from the nozzle through an intake port and exhausts a gas through an exhaust port. The intake and exhaust unit has a filtering unit that filters the flux liquid sucked through the intake port and through which the gas passes before the gas reaches the exhaust port. The filtering unit is movably provided within the intake and exhaust unit so that when installing/removing the filtering unit with respect to the intake and exhaust unit, the filtering unit moves in a direction substantially parallel to a direction in which the flux liquid is sucked through the intake port and in which the gas is exhausted through the exhaust port.

9 Claims, 8 Drawing Sheets

(51) Int. Cl.
  *B23K 1/008* (2006.01)
  *B23K 1/20* (2006.01)
  *B23K 101/42* (2006.01)

(56) References Cited

U.S. PATENT DOCUMENTS

| | | | |
|---|---|---|---|
| 2004/0173093 A1* | 9/2004 | Takahashi | B01D 19/0068 95/30 |
| 2009/0226624 A1* | 9/2009 | Shiobara | H01L 21/67051 427/401 |
| 2010/0159710 A1* | 6/2010 | Arisumi | B05B 9/04 438/778 |
| 2013/0219652 A1* | 8/2013 | Martel | A47L 9/20 15/339 |
| 2013/0316492 A1* | 11/2013 | Ushifusa | B41F 15/40 438/98 |
| 2016/0031031 A1* | 2/2016 | Yamakawa | B23K 1/203 427/8 |

* cited by examiner

APPLYING APPARATUS

BACKGROUND OF THE INVENTION

Field of the Invention

The present invention relates to a technique for exhausting a gas filtered by a filter.

Description of the Background Art

Generally, an electronic circuit is manufactured by placing electronic components on a printed circuit board and securing the electronic components using soldering. As a pre-process of the soldering, a flux liquid is applied to the printed circuit board. The flux liquid is created by diluting a flux base material with a diluent such as IPA (isopropyl alcohol). The flux liquid is applied in order to, for example, remove an oxide film on the surface of the printed circuit board to be soldered.

As an applying apparatus that applies such a flux liquid, there is a known applying apparatus that injects the flux liquid from a nozzle to apply the flux liquid to a printed circuit. When the flux liquid is injected from the nozzle, the flux liquid is applied to the printed circuit board and the nebulosus flux liquid diffuses in the applying apparatus.

IPA included in the flux liquid volatilizes at room temperature and may explode if it catches fire. Accordingly, the nebulosus flux liquid (referred to below as "sprayed flux") in the applying apparatus needs to be exhausted externally from the apparatus. If the applying apparatus exhausts the sprayed flux without performing any process on an exhaust pipe connected to the applying apparatus, the flux base material is attached to the inside of the exhaust pipe, thereby polluting the exhaust pipe. Accordingly, the applying apparatus performs filtering using a filter when exhausting the sprayed flux to the exhaust pipe, removes the flux base material, and exhausts the evaporated IPA externally from the apparatus.

There is a conventional method for filtering the sprayed flux in this way. For example, an exhaust duct with a filter is provided above the nozzle (the upper portion of the applying apparatus) to exhaust the gas having passed through the filter externally from the apparatus. In another example, a mist recovery box with a filter is provided below the nozzle (the lower portion of the applying apparatus) to filter the sprayed flux and recover the flux to the box.

However, when adopting a technique placing the exhaust duct with a filter above the nozzle, a part of the sprayed flux may remain in the applying apparatus. That is, since IPA is heavier than air and the sprayed flux including IPA is much heavier than air, a part of sprayed flux may remain below the nozzle. On the other hand, when adopting a technique placing a filter below the nozzle to filter the sprayed flux, the operator needs to stop injecting the flux liquid from the nozzle when exchanging the filter. As a result, the productivity of the applying apparatus is reduced.

SUMMARY OF THE INVENTION

According to an aspect of the present invention, an applying apparatus that applies a flux liquid includes: a nozzle from which the flux liquid is injected; and an intake and exhaust unit that sucks the flux liquid injected from the nozzle through an intake port and exhausts a gas through an exhaust port. The intake and exhaust unit has a filtering unit that filters the flux liquid sucked through the intake port and through which the gas passes before the gas reaches the exhaust port. The filtering unit is movably provided within the intake and exhaust unit so that when installing/removing the filtering unit with respect to the intake and exhaust unit, the filtering unit moves in a direction substantially parallel to a direction in which the flux liquid is sucked through the intake port and in which the gas is exhausted through the exhaust port.

Accordingly, in the applying apparatus, the filtering unit is detachable in a direction substantially parallel to the suction direction and the exhaust direction. Therefore, even when other apparatuses are provided adjacent to both sides, the filter can be exchanged without stopping the operation. As a result, the applying apparatus can operate without reducing the productivity.

According to another aspect of the invention, the intake and exhaust unit has a first chamber through which the flux liquid reaches the filtering unit from the intake port, and a second chamber through which the gas having passed through the filtering unit reaches the exhaust port. A width of the first chamber in a direction orthogonal to the direction in which the filtering unit moves is smaller than a width of the second chamber in the direction orthogonal to the direction in which the filtering unit moves.

Accordingly, in the applying apparatus, the width of the first chamber of the intake and exhaust unit is made relatively smaller to relatively increase the flow rate of the flux liquid before being filtered, so that the flux liquid is filtered in the entire range of the filtering unit. In addition, since the width of the second chamber is made relatively larger, the gas having passed through the second range of the filtering unit flows into the tip of the exhaust port even in a relatively distant position. As a result, the applying apparatus can efficiently exhaust the gas having passed through the filter through the exhaust port.

Therefore, an object of the invention is to provide a technique for exchanging the filter in an easy method without stopping the operation of the apparatus.

These and other objects, features, aspects and advantages of the present invention will become more apparent from the following detailed description of the present invention when taken in conjunction with the accompanying drawings.

DESCRIPTION OF THE EMBODIMENTS

Embodiments of the present invention will be described below with reference to the drawings.

1. First Embodiment

<1-1. Summary of Applying System>

Figure 1:
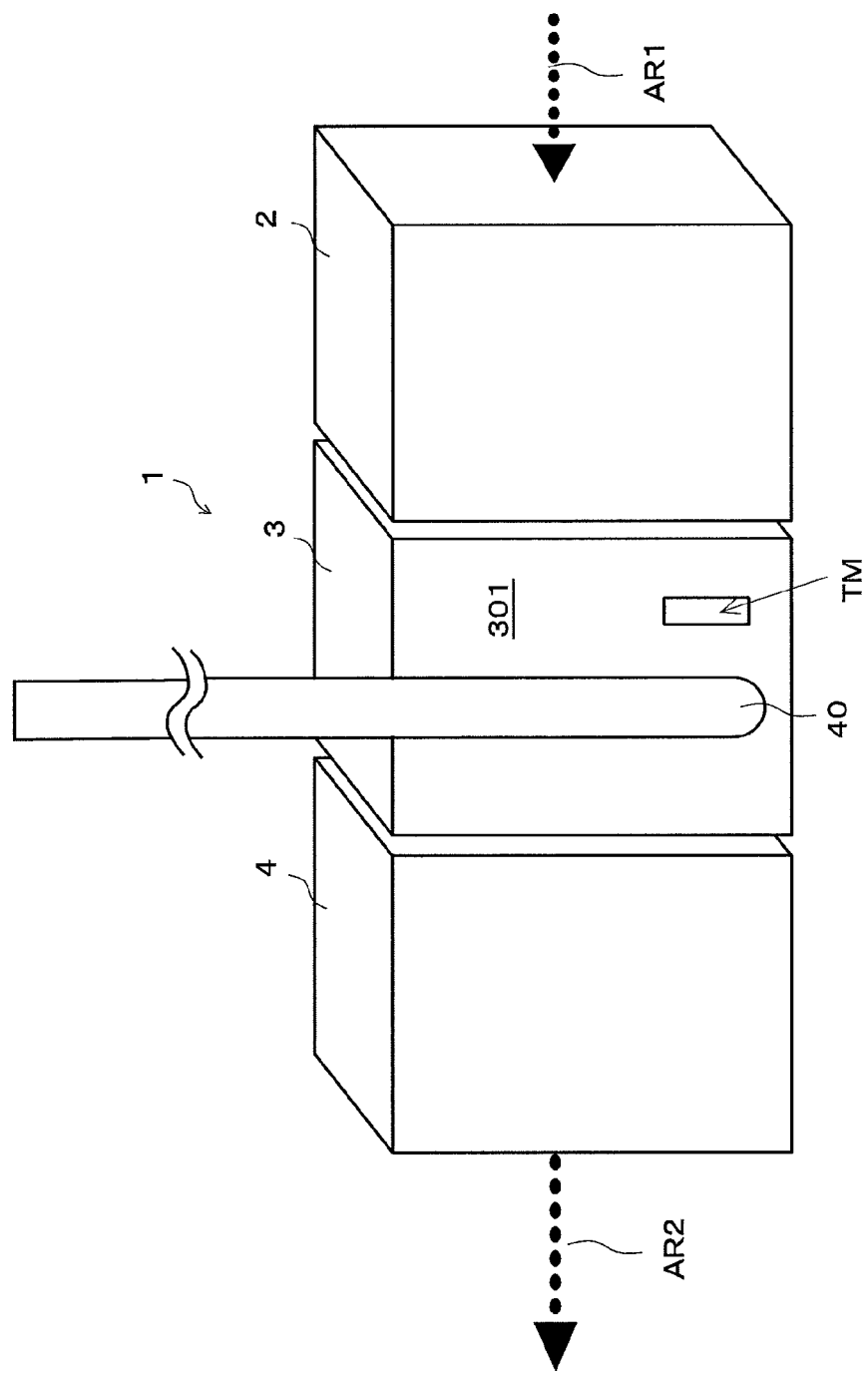
FIG. 1 schematically shows an applying system.

FIG. 1 schematically shows an applying system 1 according to a first embodiment. The applying system 1 mainly includes an assembling apparatus 2, a flux applying apparatus 3, and a soldering apparatus 4.

This applying system 1 solders electronic components placed on a printed circuit board. Specifically, a printed circuit board is conveyed to the assembling apparatus 2 in the direction of an arrow AR1. The conveyed printed circuit board passes through the flux applying apparatus 3 and the soldering apparatus 4 and is conveyed in the direction of an arrow AR2. That is, the printed circuit board on which electronic components have been soldered is conveyed. The applying system 1 manufactures an electronic circuit of the printed circuit board on which electronic components have been soldered in this way.

Since the printed circuit board is conveyed to the apparatuses sequentially in the applying system 1 as described above, the apparatuses are arranged adjacent to each other. Specifically, the assembling apparatus 2 is adjacent to one side of the applying apparatus 3 and the soldering apparatus 4 is adjacent to the other side of the applying apparatus 3. That is, a first apparatus (for example, the assembling apparatus 2) is provided adjacent to one side of the applying apparatus 3 and a second apparatus (for example, the soldering apparatus 4) is provided adjacent to the other side facing the one side. Accordingly, an exhaust pipe 40 connected to the applying apparatus 3 is provided in a surface (for example, a rear surface 301 of the applying apparatus 3) other than both sides to which the other apparatuses are adjacent.

The exhaust pipe 40 is a conduit pipe through which a gas (IPA gas) exhausted from the applying apparatus 3 passes. Since the other apparatuses are provided adjacent to both sides of the applying apparatus 3, a detachable opening TM through which a filtering unit described later is removed or attached is also provided in the rear surface 301. Next, the apparatuses included in the applying system 1 will be described.

The assembling apparatus 2 places components on the printed circuit board. The assembling apparatus 2, for example, places a connector on the printed circuit board. A connector is used when communication using an electric signal is performed. The assembling apparatus 2 conveys the printed circuit board on which electronic components have been placed to the flux applying apparatus 3.

The flux applying apparatus 3 (referred to below as "the applying apparatus 3") applies a flux liquid to sections to be soldered of the printed circuit board. The flux liquid is stored in a tank (not shown) and injected from a nozzle through a conduit pipe interconnecting the tank and the nozzle of the applying apparatus 3. The flux liquid is applied to the sections to be soldered of the printed circuit board. The applying apparatus 3 conveys the printed circuit board to the soldering apparatus 4 after applying the flux liquid to the printed circuit board.

The soldering apparatus 4 solders the sections to be soldered of the printed circuit board. The flux liquid is applied to the sections to be soldered of the printed circuit board by the applying apparatus 3 in advance and soldering is performed in a state in which an oxide film is removed.

<1-2. Structure of Applying Apparatus>

Figure 2:
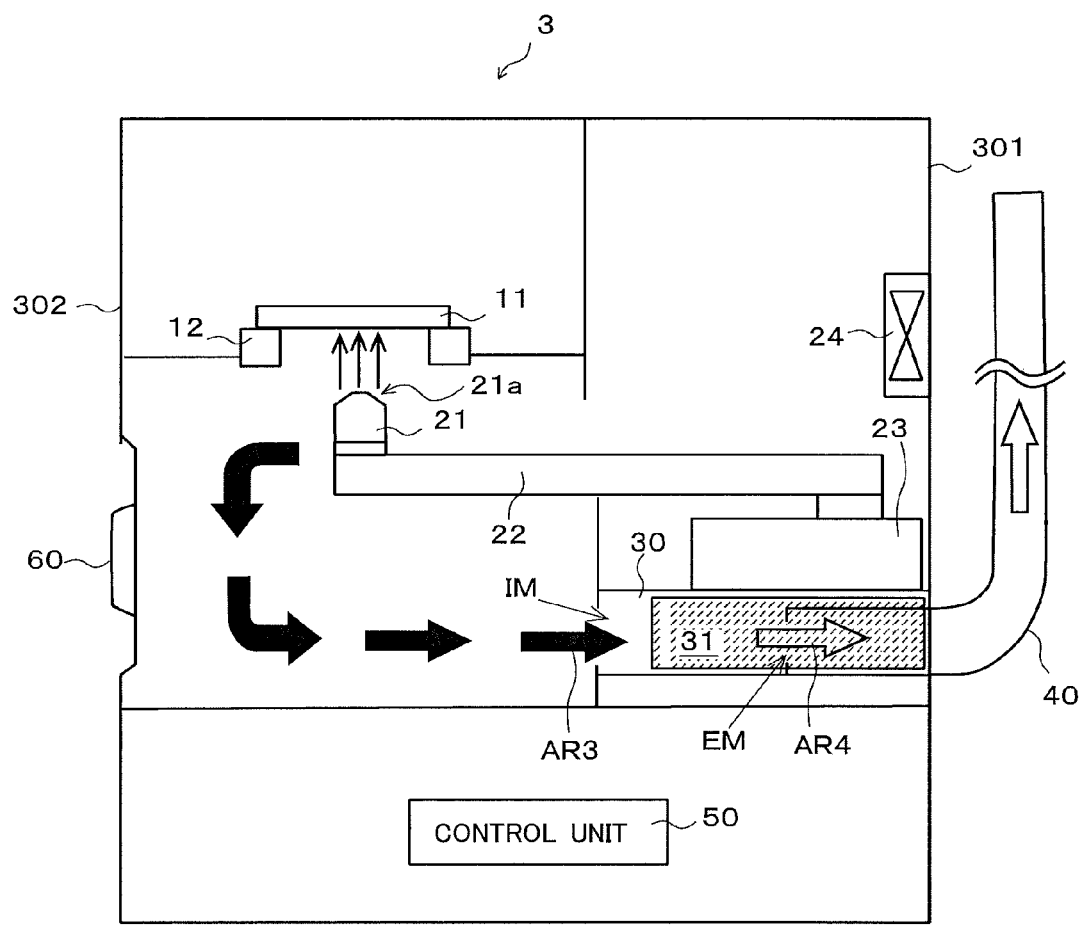
FIG. 2 shows the structure of an applying apparatus.

Next, the structure of the applying apparatus 3 will be described with reference to FIG. 2. The applying apparatus 3 shown in FIG. 2 performs application processing that applies the flux liquid to a printed circuit board 11 as a pre-process of soldering. The applying apparatus 3 conveys the target printed circuit board 11 to which the flux liquid is applied by driving a conveying unit 12, which will be described later, and applies the flux liquid to the lower surface of the printed circuit board 11.

Electronic components such as a connector to be soldered are placed on the printed circuit board 11. The applying apparatus 3 applies the flux liquid to the target area (area in which electronic components are placed) to be soldered, which is a part on the lower surface of the printed circuit board 11.

The applying apparatus 3 mainly includes the conveying unit 12, a nozzle 21, a nozzle moving unit 22, a main body 23, a blower 24, an intake and exhaust unit 30, the exhaust pipe 40, a control unit 50, and a work door 60.

The conveying unit 12 moves a palette (not shown). The palette is a member on which the printed circuit board 11 is placed and makes application of the flux only to the necessary portion of the printed circuit board 11. The conveying unit 12 moves the printed circuit board 11 conveyed from the assembling apparatus 2 to the processing position. The application processing is performed in a state in which the printed circuit board 11 stays at the processing position. Upon completion of the application processing of the printed circuit board 11, the conveying unit 12 conveys the palette on which the printed circuit board 11 has been placed, externally from the applying apparatus 3.

The nozzle 21 is, for example, a spray nozzle that nebulizes the flux liquid nebulosus and injects the nebulosus flux liquid. In such application processing, the nozzle 21 applies the flux liquid to the printed circuit board 11 placed in the processing position. The nozzle 21 applies the flux liquid to the lower surface of the printed circuit board 11 by injecting the flux liquid upward through a nozzle opening 21a at the top of the nozzle 21.

The nozzle moving unit 22 is, for example, an orthogonal robot to which the fixed nozzle 21 has been attached and moves the nozzle 21 in a direction formed by two axes along a substantially horizontal plane. The nozzle moving unit 22 moves the nozzle 21 according to the target area to be soldered of the printed circuit board 11 in application processing. This enables the nozzle 21 to apply the flux liquid to the target area of the printed circuit board 11.

The main body 23 includes a power supply that drives the nozzle 21, the nozzle moving unit 22 and so on. The nozzle moving unit 22 moves the nozzle 21 to any position by receiving electric power from this power supply. Then, the nozzle 21 performs application processing on the printed circuit board 11.

The blower 24 blows air to the printed circuit board 11 placed on the palette from its installation position. By blowing air in this direction, the blower 24 prevents the sprayed flux injected like a mist from entering the area in which the main body 23 is provided, so that an explosion in the applying apparatus 3 does not occur due to fire ignition of the sprayed flux if, for example, the power supply of the main body 23 is short-circuited.

The intake and exhaust unit 30 is provided in a lower position of the applying apparatus 3, which is below the position of the nozzle 21. The intake and exhaust unit 30 mainly includes an intake port IM, a filtering unit 31, and an exhaust port EM. The intake and exhaust unit 30 sucks the sprayed flux through the intake port IM and exhausts the gas having passed through the filtering unit 31, through the exhaust port EM. The gas (that is, the filtered gas) having passed through the filtering unit 31 is mainly vaporized IPA (IPA gas). As shown in FIG. 2, the direction of an arrow AR3 in which the sprayed flux is sucked through the intake port IM is substantially parallel with the direction of an arrow AR4 in which the IPA gas is exhausted through the exhaust port EM. The IPA gas exhausted through the exhaust port EM is exhausted externally from the applying apparatus 3 through the exhaust pipe 40. This prevents the sprayed flux from remaining in the applying apparatus 3.

Since the sprayed flux is heavier than air, after application processing, the sprayed flux not attached to the printed circuit board 11 moves to a position lower than the nozzle 21. Due to the rotation of a fan (not shown) provided in any position in the exhaust pipe 40, air in the applying apparatus 3 is sucked toward the exhaust port EM of the exhaust pipe 40. That is, the sprayed flux having moved to a position lower than the nozzle 21 due to the rotation of the fan is sucked through the intake port IM of the intake and exhaust unit 30. Then, the IPA gas having passed through the filtering unit 31 is exhausted through the exhaust port EM, passes through the exhaust pipe 40, and is exhausted externally from the applying apparatus 3.

The exhaust pipe 40 includes an internal exhaust pipe of a conduit pipe extending into the intake and exhaust unit 30 and an external exhaust pipe of a conduit pipe extending outside the intake and exhaust unit 30. The specific structure of the internal exhaust pipe will be described later.

The control unit 50 is, for example, a programmable logic controller (PLC). The control unit 50 controls the operation of the conveying unit 12, the nozzle 21, the nozzle moving unit 22, and so on by performing processing according to a program.

The work door 60 is a door that is provided, for example, in a front surface 302 of the applying apparatus 3 and opened or closed manually by an operator, who is a user of the applying apparatus 3. The work door 60 is opened when, for example, the operator cleans the nozzle 21 or maintains another device in the applying apparatus 3. At this time, the applying apparatus 3 is put in a state in which the operation is stopped. When the operator starts the applying apparatus 3, the work door 60 is closed. This is performed to prevent the sprayed flux moving inside the applying apparatus 3 from leaking externally from the apparatus.

<1-3. Structure of Intake and Exhaust Unit>

Figure 3:
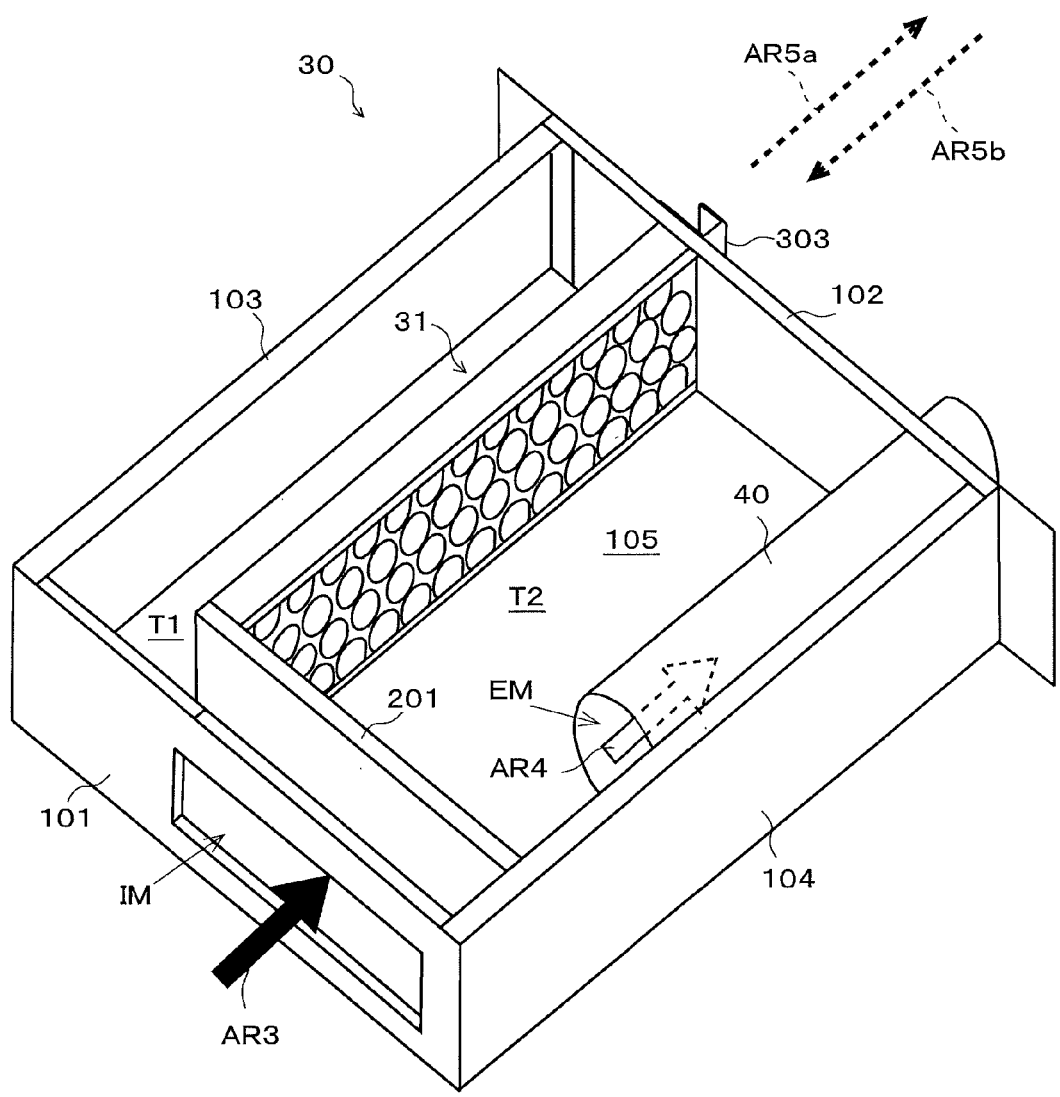
FIG. 3 is the structure of an intake and exhaust unit in which a filtering unit has been installed.
Figure 4:
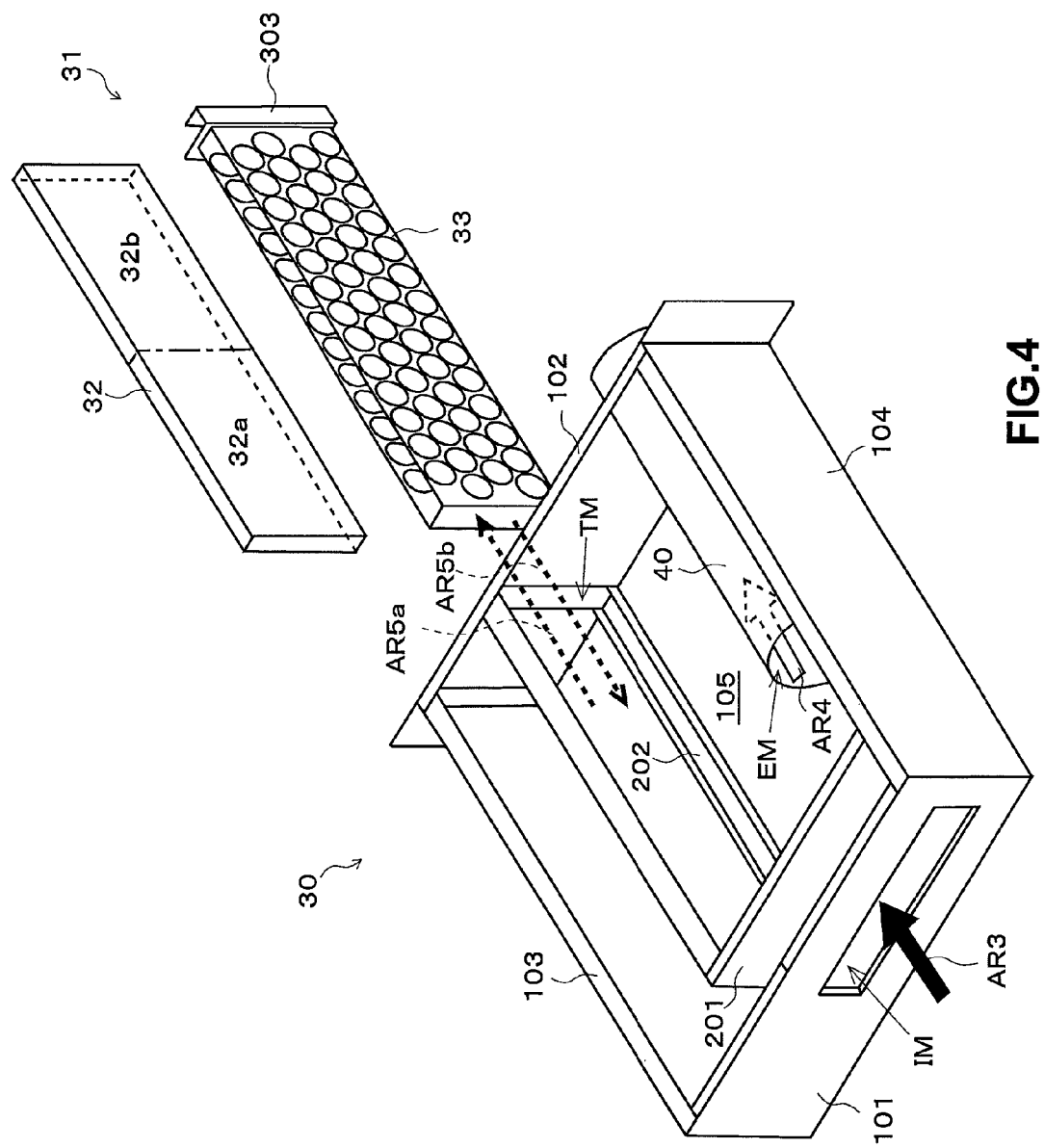
FIG. 4 shows the structure of the intake and exhaust unit when a filter of the filtering unit is exchanged.
Figure 5:
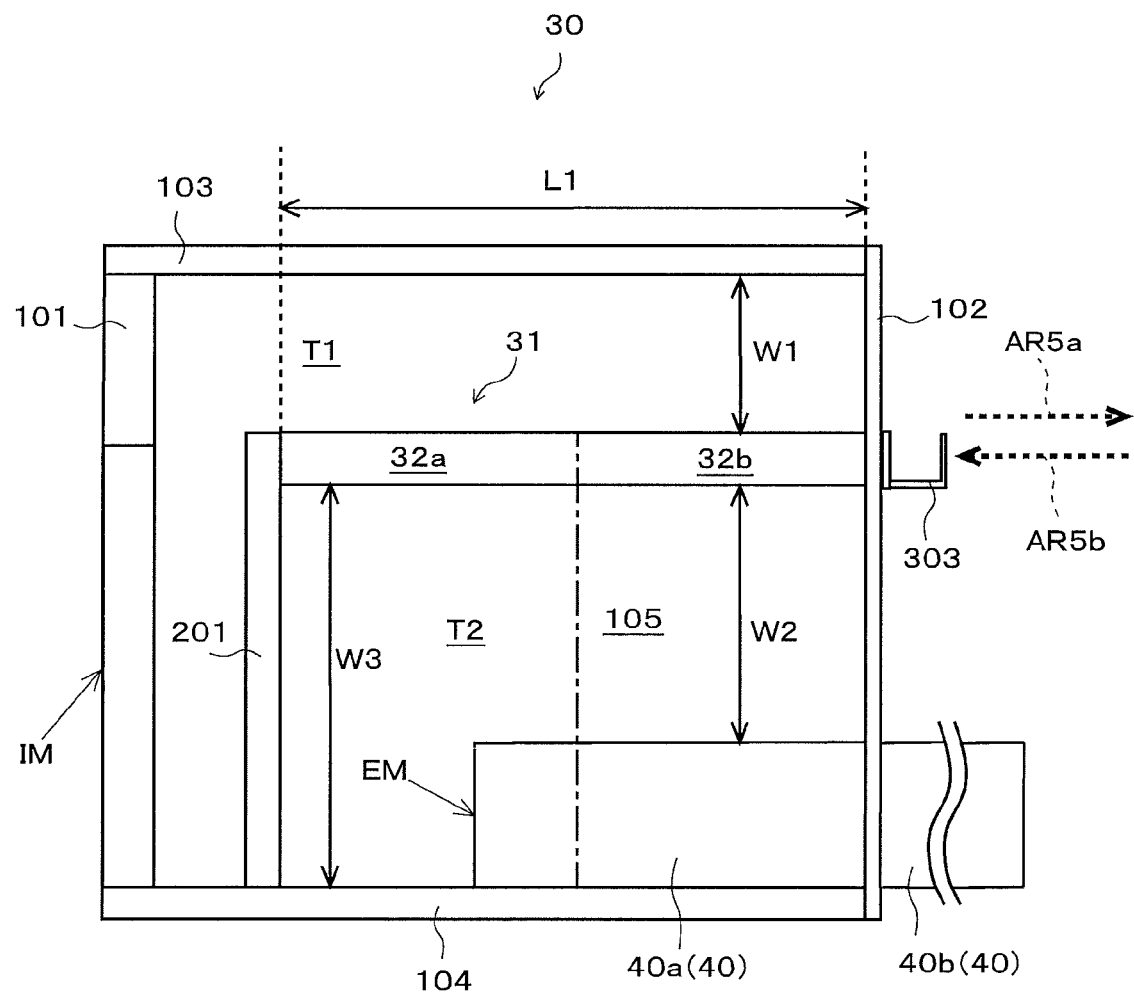
FIG. 5 shows the structures of a first chamber, a second chamber, and an exhaust pipe of the intake and exhaust unit.

Next, the structure of the intake and exhaust unit 30 will be described with reference to FIGS. 3 to 5. FIG. 3 shows the structure of the intake and exhaust unit 30 to which the filtering unit 31 has been attached.

The intake and exhaust unit 30 is a rectangular parallelepiped box that mainly includes a first side plate 101 having the intake port IM, a second side plate 102 connected to the exhaust pipe 40, a third side plate 103, a fourth side plate 104, and bottom plate 105. Specifically, the intake and exhaust unit 30 includes the bottom plate 105 and another bottom plate provided substantially parallel to the bottom plate 105 as the bottom surfaces of the rectangular parallelepiped box and the first side plate 101 to the fourth side plate 104 as the sides of the rectangular parallelepiped box. Note that the first side plate 101 is provided substantially parallel to the second side plate 102. In addition, the third side plate 103 is provided substantially parallel to the fourth side plate 104. The intake and exhaust unit 30 includes these four side plates and the two bottom plates including the bottom plate 105. However, one of the two bottom plates is not shown in order to show the inside of the intake and exhaust unit 30.

In the intake and exhaust unit 30, the filtering unit 31 and a dividing plate 201 are provided. These two members divide the inside of the intake and exhaust unit 30 into two areas: a first chamber T1 and a second chamber T2. As described above, the dividing plate 201 and the filtering unit 31 are compartment sections that divide the inside of the intake and exhaust unit 30. The compartment section is L-shaped, and the filtering unit 31 is provided in the longitudinal direction and the dividing plate 201 is provided in the lateral direction.

Specifically, the dividing plate 201 is provided in a direction orthogonal to the direction (the direction of the arrow AR3) in which the sprayed flux is sucked through the intake port IM. The dividing plate 201 is provided so as to face the intake port IM and has one end intersecting the fourth side plate 104 and the other end intersecting one end of the filtering unit 31. This prevents the sprayed flux sucked through the intake port IM from directly flowing into the exhaust port EM before being filtered.

The filtering unit 31 is provided substantially parallel to the direction in which the sprayed flux is sucked through the intake port IM. Specifically, the filtering unit 31 is provided so as to have one end intersecting the other end of the dividing plate 201 and the other end intersecting the second side plate 102. In addition, a gripper 303 is provided at the other end of the filtering unit 31. Even when the applying apparatus 3 is operating, the operator can withdraw the filtering unit 31 through the detachable opening TM in the direction of the arrow AR5*a* while grasping the gripper 303. The operator can also attach the filtering unit 31 to the intake and exhaust unit 30 by inserting the filtering unit 31 through the detachable opening TM in the direction of an arrow AR5*b*. As described above, no apparatus is provided adjacently in the direction in which the operator attaches or detaches the filtering unit 31. Accordingly, the operator can easily attach or detach the filtering unit 31 in a state in which the applying apparatus 3 is operating.

As described above, the filtering unit 31 is movably provided substantially parallel to the direction (the direction of the arrow AR3) in which the sprayed flux is sucked through the intake port IM and the direction (the direction of the arrow AR4) in which the IPA gas is exhausted through the exhaust port EM.

Accordingly, even when other apparatuses are disposed on both sides adjacently, the applying apparatus 3 can exchange the filter of the filtering unit 31 without stopping operation. As a result, the applying apparatus 3 can perform the exchange without reduction in the productivity.

Next, the structure of the intake and exhaust unit 30 when the filter of the filtering unit 31 is exchanged will be described with reference to FIG. 4.

When exchanging the filter, the operator withdraws the filtering unit 31 in the direction of the arrow AR5*a* along a guide rail 202 through the detachable opening TM while grasping the gripper 303 of the filtering unit 31. The direction of the arrow AR5*a* is substantially parallel to the direction (the direction of the arrow AR3) in which the sprayed flux is sucked through the intake port IM and the direction (the direction of the arrow AR4) in which the IPA gas is exhausted through the exhaust port EM.

The withdrawn filtering unit 31 can be separated into a filter 32 and a filter cassette 33. The operator removes the used filter 32 from the filter cassette 33 and attaches a new filter 32 to the filter cassette 33. After attaching the filter 32 to the filter cassette 33, the operator inserts the filtering unit 31 in the direction of the arrow AR5*b* along the guide rail 202 through the detachable opening TM while grasping the gripper 303. The direction of the arrow AR5*b* is substantially parallel to the direction (the direction of the arrow AR3) in which the sprayed flux is sucked through the intake port IM and the direction (the direction of the arrow AR4) in which the IPA gas is exhausted through the exhaust port EM.

The filter 32 is a nonwoven cloth made of resin material such as, for example, nylon. In the following description, to differentiate the range in which the sprayed flux is filtered by the filter 32, the range of the filter 32 corresponding to the start position of the filter cassette 33 to the substantially middle position is assumed to be a first range 32*a*. In addition, the range of the filter 32 corresponding to the substantially middle position of the filter cassette 33 to the position of the gripper 303 at the end is assumed to be a second range 32*b*.

<1-4. Air Flow in Intake and Exhaust Unit>

Next, the flows of the sprayed flux and the IPA gas in the above intake and exhaust unit 30 will be described. First, the structures of the first chamber T1, the second chamber T2, and the exhaust pipe 40 of the intake and exhaust unit 30 will be specifically described with reference to FIG. 5. The first chamber T1 shown in FIG. 5 is an area through which the sprayed flux reaches the filtering unit 31 from the intake port IM. The second chamber T2 is an area through which the IPA gas having passed through the filtering unit 31 reaches the exhaust port EM of the internal exhaust pipe 40*a*.

The length of the first chamber T1 in a direction orthogonal to the direction (the direction of the arrow AR5*a* and the direction of the arrow AR5*b*) in which the filtering unit 31 moves is a width W1. In addition, the length of the second chamber T2 in a direction orthogonal to the direction in which the filtering unit 31 moves is a width W2. However, the length of the width W2 does not include the area of the internal exhaust pipe 40*a* in the second chamber T2. The length including the area of the internal exhaust pipe 40*a* is the length of a width W3.

The width W1, which is the length of the first chamber T1, is smaller than the width W2, which is the length of the second chamber T2. Since the width of the first chamber T1 is relatively smaller as described above, the sprayed flux sucked through the intake port IM moves through the first chamber T1 at a relatively high speed and flows into the vicinity of a second range 32*b* of the filtering unit 31. Then, the sprayed flux passes through the second range 32*b*. Since the width of the second chamber T2 is relatively larger, the IPA gas having passed through the second range 32*b* surely flows into the exhaust port EM even when the IPA gas is present in a position relatively distant from the exhaust port EM. The IPA gas having reached the exhaust port EM passes through the internal exhaust pipe 40*a* from the exhaust port EM and is exhausted to the external exhaust pipe 40*b* provided outside the applying apparatus 3.

The length of the internal exhaust pipe 40*a* is smaller than the entire length of the filtering unit 31 and larger than one-half the entire length of the filtering unit 31 as shown in the dot-and-dash line. Accordingly, the distance between the exhaust port EM and the first range 32*a* of the filtering unit 31 is relatively smaller. This causes the sprayed flux flowing through the first chamber T1 to pass through the first range 32*a* and flow into the exhaust port EM substantially linearly. When the filtering unit 31 is attached to the intake and exhaust unit 30, the entire length of the filtering unit 31 is equivalent to the length L1 from the position in which the filtering unit 31 is in contact with the dividing plate 201 to the position in which the filtering unit 31 is in contact with the second side plate 102.

As described above, the width of the first chamber T1 through which the sprayed flux passes is made relatively smaller as the width W1 and the width of the second chamber T2 through which the IPA gas passes is made relatively larger as the width W2. In addition, the internal exhaust pipe 40*a* extending into the intake and exhaust unit 30 is provided. This enables the sprayed flux to be filtered in the entire range including the first range 32*a* and the second range 32*b* of the filtering unit 31, thereby reducing the man-hour and cost of a filter exchange.

Next, the flows of the sprayed flux and IPA gas in the intake and exhaust unit 30 will be described with reference to FIG. 6. The sprayed flux is sucked in the direction of the arrow AR3 through the intake port IM of FIG. 6 and flows in the direction of the arrow AR5 along the dividing plate 201. Then, the sprayed flux flows in the direction of an arrow AR6 and an arrow AR7 along the filtering unit 31. As described above, the first chamber through which the sprayed flux reaches the vicinity of the filtering unit 31 from the intake port IM has a relatively small width (width W1). Accordingly, the sprayed flux has a relatively high flow rate and flows through the entire area including the end portion (portion facing the second side plate 102) in the first chamber, which is an L-shaped area.

The sprayed flux having flowed through the entire first chamber is filtered in a range D1 including the first range 32*a* and the second range 32*b* of the filtering unit 31. The length of the range D1 is equivalent to the length L1 described in FIG. 5. As a result, the IPA gas having passed through the first range 32*a* flows toward the exhaust port EM in the direction of an arrow AR8. The IPA gas having passed through the first range 32*a* in this way flows into the exhaust port EM substantially linearly from a position relatively in the vicinity of the exhaust port EM. The IPA gas having passed through the second range 32*b* flows toward the exhaust port EM in the direction of an arrow AR9. The IPA gas having passed through the second range 32*b* in this way flows toward the exhaust port EM along the internal exhaust pipe 40*a* from a relatively distant position. In other words, the IPA gas having passed through the second range 32*b* flows in a direction substantially opposite to the direction (the direction of the arrow AR7) in which the sprayed flux flows before passing through the second range 32*b* of the filtering unit 31 and then flows toward the exhaust port EM. As described above, in the structure of the intake and exhaust unit 30, the sprayed flux can be filtered using the entire range of the filter 32 including the first range 32*a* and the second range 32*b*. As a result, the applying apparatus 3 can reduce the man-hour and cost of a filter exchange.

As described above, in the embodiment, the sprayed flux sucked through the intake port IM of the intake and exhaust unit 30 moves in the direction of the arrow AR5 along the dividing plate 201 in the first chamber T1. When the sprayed flux moves in the direction of the arrow AR6, a part of the sprayed flux is filtered in the first range 32*a* of the filtering unit 31. The IPA gas having passed through the first range 32*a* moves in the direction of the arrow AR8, is sucked through the exhaust port EM located relatively close to the filter section of the first range 32*a*, passes through the external exhaust pipe 40*b* from the internal exhaust pipe 40*a*, and is exhausted externally from the applying apparatus 3.

The remaining sprayed flux not filtered in the first range 32*a* of the flux filtering unit 31 moves in the direction of the arrow AR7 and is filtered in the second range 32*b*. The IPA gas having passed through the second range 32*b* moves in the direction of the arrow AR9, is sucked through the exhaust port EM, passes through the external exhaust pipe 40*b* from the internal exhaust pipe 40*a*, and is exhausted externally from the applying apparatus 3. In the embodiment, the width of the first chamber T1 of the intake and exhaust unit 30 through which the sprayed flux passes is made relatively smaller as the width W1, the width of the second chamber T2 through which the IPA gas passes is made relatively larger as the width W2, and the internal exhaust pipe 40*a* extending into the intake and exhaust unit 30 is provided. This enables the sprayed flux to be filtered in the entire range (the range D1) including the first range 32*a* and the second range 32*b* of the filtering unit 31, thereby reducing the man-hour and cost of a filter exchange.

The intake and exhaust unit 30 according to the embodiment has individual effects using the above structure. Next, the structure and the like of another intake and exhaust unit obtained by partially modifying the structure of the intake and exhaust unit 30 will be described and the difference with the structure and the like of the intake and exhaust unit 30 according to the above embodiment will be described.

<1-5. Comparison with Another Intake and Exhaust Unit>

Figure 6:
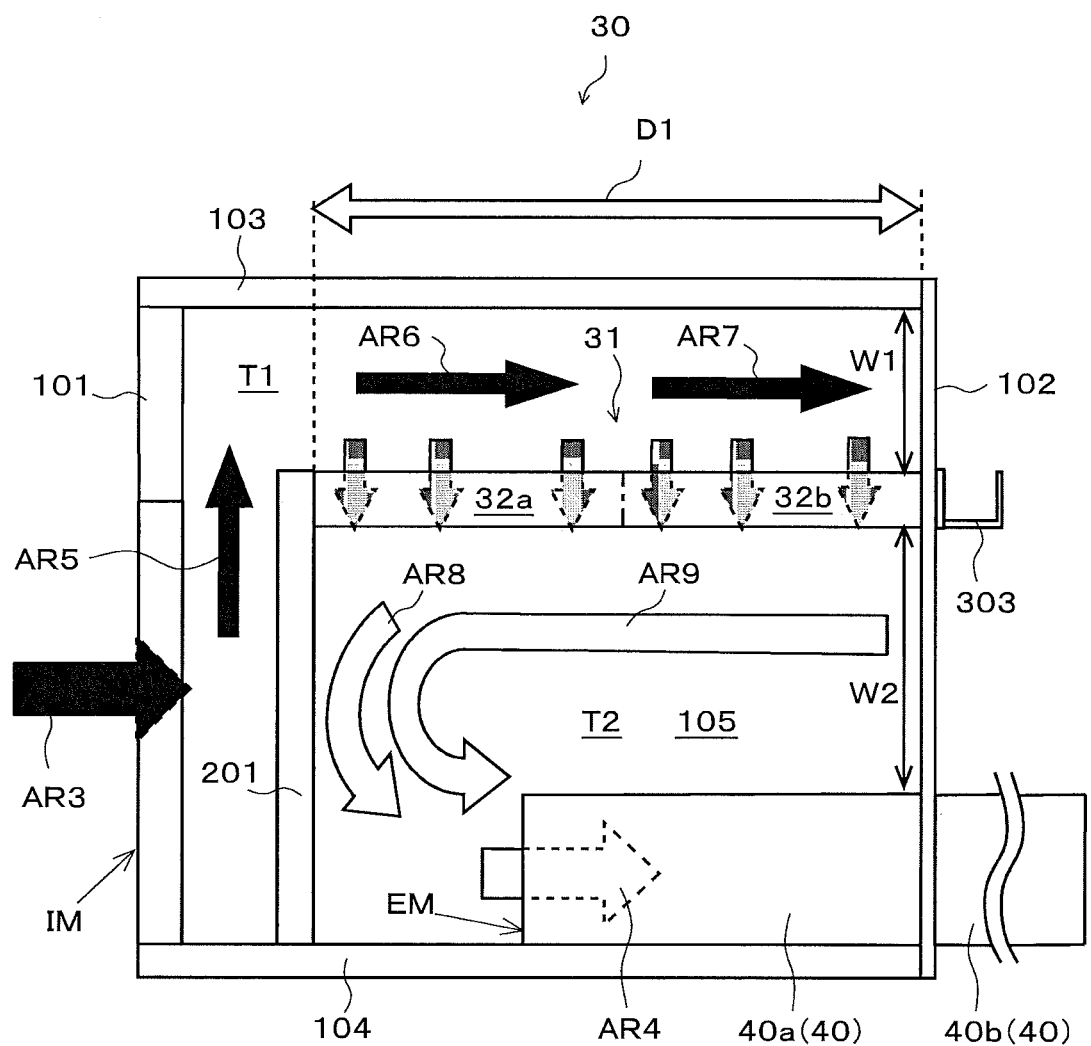
FIG. 6 shows the flows of sprayed flux and an IPA gas in the intake and exhaust unit.
Figure 7:
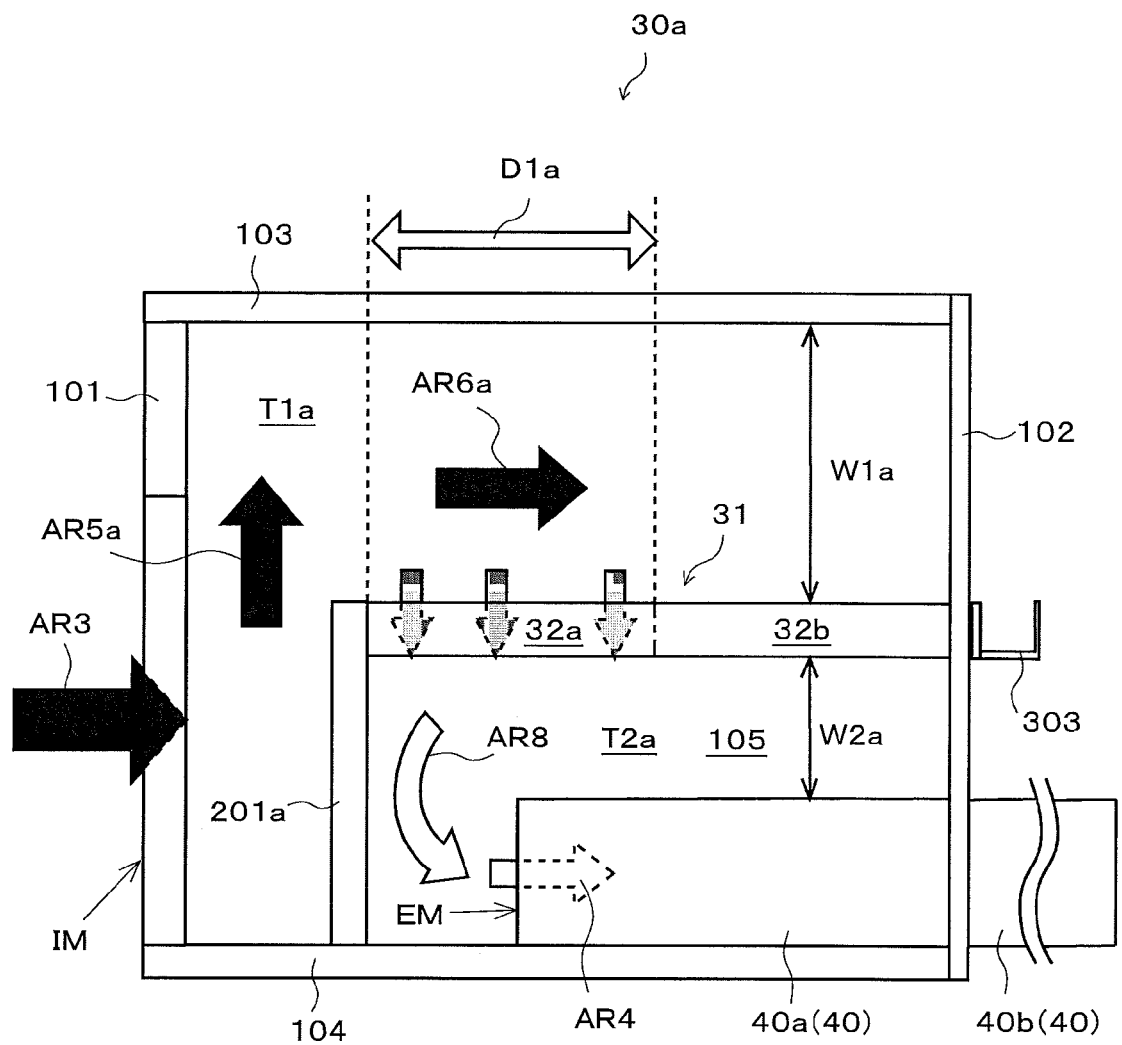
FIG. 7 shows another structure of the intake and exhaust unit.

FIG. 7 shows another structure of the intake and exhaust unit. The intake and exhaust unit 30*a* shown in FIG. 7 has a wider first chamber and a narrower second chamber than the intake and exhaust unit 30 shown in FIG. 6. That is, in the first chamber T1*a* of the intake and exhaust unit 30*a* shown in FIG. 7, the length in a direction orthogonal to the direction in which the filtering unit 31 moves is a width W1*a*. The length of the width W1*a* is larger than the length of the width W1 of the first chamber T1 in FIG. 6. The length of a width W2*a* of the second chamber T2*a* is smaller than the length of the width W2 of the second chamber T2 in FIG. 6. As a result, the sprayed flux moves in the directions of the arrows AR3, AR5*a*, and AR6*a* sequentially and the flow rate becomes relatively smaller.

Since the exhaust port EM is relatively close to the first range 32*a* of the filtering unit 31, most of the sprayed flux moving in the direction of the arrow AR6*a* passes through the first range 32*a*. In other words, most of the sprayed flux does not reach the end of the first chamber T1*a*. The IPA gas having passed through the first range 32*a* flows into the exhaust port EM. As described above, most of the sprayed flux sucked through the intake port IM is filtered in the range D1*a*, which corresponds to the first range 32*a* of the filtering unit 31.

Accordingly, the range in which the sprayed flux is filtered by the filtering unit 31 of the intake and exhaust unit 30*a* in FIG. 7 is smaller than the range D1 shown in FIG. 6. As a result, the second range 32*b* of the filtering unit 31 is hardly used for filtering. Accordingly, the man-hour and cost necessary for a filter exchange in the intake and exhaust unit 30*a* is greater than the man-hour and cost necessary for a filter exchange in the intake and exhaust unit 30 shown in FIG. 6. On the other hand, in the intake and exhaust unit 30 shown in FIG. 6, the filtering unit 31 performs filtering in the range D1, which is larger than the range D1*a*. Accordingly, the man-hour and cost necessary for a filter exchange can be reduced.

Figure 8:
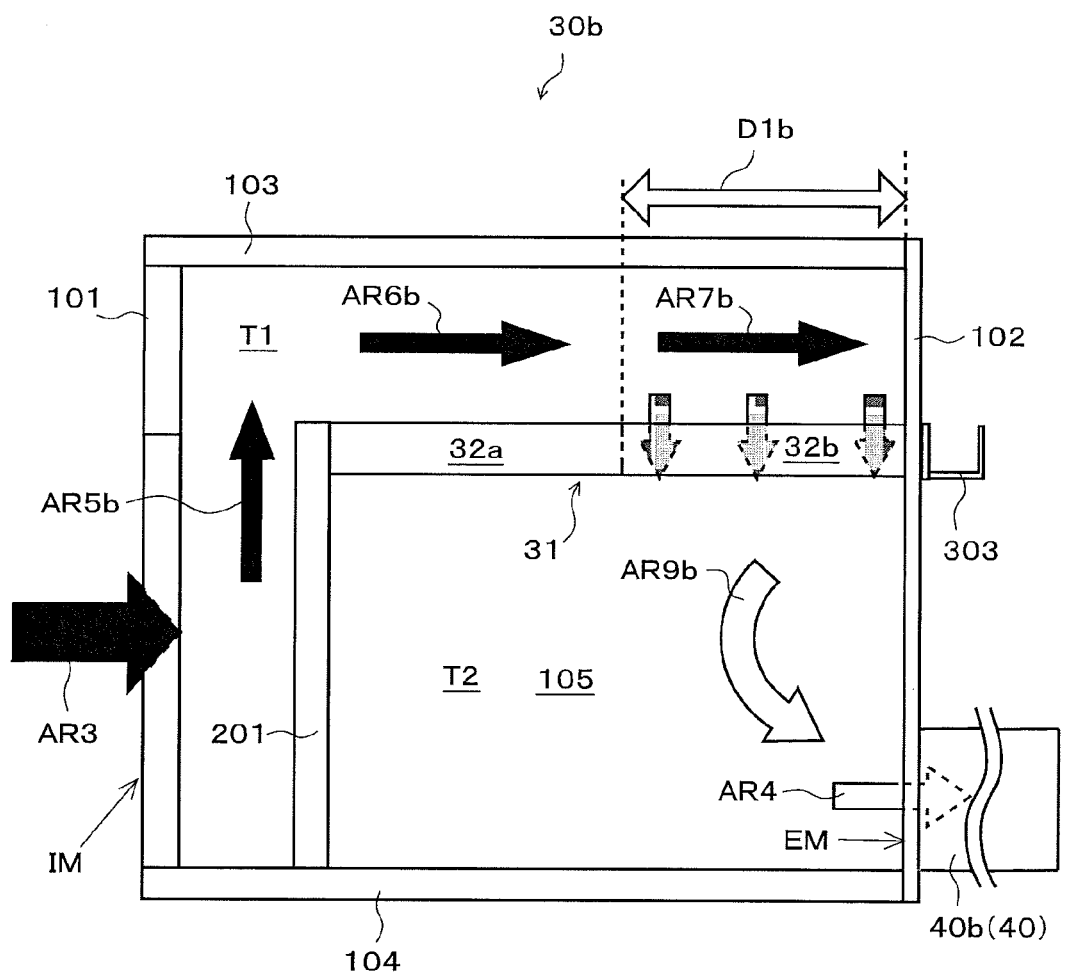
FIG. 8 shows another structure of the intake and exhaust unit.

FIG. 8 shows another structure of the intake and exhaust unit. The intake and exhaust unit 30*b* shown in FIG. 8 does not have the internal exhaust pipe 40*a*, which is present in the intake and exhaust unit 30 shown in FIG. 6. Accordingly, in the intake and exhaust unit 30*b*, the exhaust pipe 40 does not extend into the intake and exhaust unit 30 and only the external exhaust pipe 40*b* is connected to the applying apparatus 3. In addition, the position of the exhaust port EM is a point at which the external exhaust pipe 40*b* is connected to the intake and exhaust unit 30*b*.

The sprayed flux flows from the intake port IM in the directions of the arrow AR3, the arrow AR5*b*, the arrow AR6*b*, and the arrow AR7*b* sequentially. Since the width (width W1) of the first chamber T1 is relatively smaller, the flow rate of the sprayed flux becomes relatively higher and the sprayed flux flows through the entire range including the end of the first chamber.

Since the exhaust port EM is relatively close to the second range 32*b* of the filtering unit 31, most of the sprayed flux moving in the direction of the arrow AR6*a* and in the direction of the arrow AR7*b* passes through the second range 32*b*. In other words, most of the sprayed flux does not pass through first range 32*a*, which is relatively distant from the exhaust port EM.

The IPA gas having passed through the second range 32*b* flows into the exhaust port EM in the direction of an arrow AR9*b*. The IPA gas having passed through the second range 32*b* in this way flows into the exhaust port EM substantially linearly.

Accordingly, the range in which the sprayed flux is filtered by the filtering unit 31 of the intake and exhaust unit 30*b* in FIG. 8 is smaller than the range D1 shown in FIG. 6. As a result, the first range 32*a* of the filtering unit 31 is hardly used for filtering. Accordingly, the man-hour and cost necessary for a filter exchange in the intake and exhaust unit 30*b* is greater than the man-hour and cost necessary for a filter exchange in the intake and exhaust unit 30 shown in FIG. 6. On the other hand, in the intake and exhaust unit 30 shown in FIG. 6, the filtering unit 31 performs filtering in the range D1, which is larger than the range D1*b*. Accordingly, the man-hour and cost necessary for a filter exchange can be reduced.

2. Modifications

Although embodiments of the invention have been described above, the invention is not limited to the above embodiments and various modifications can be made. Such modifications will be described below. All embodiments including the above embodiments and the following embodiments may be combined as appropriate.

In the above embodiments, the applying system 1 mainly includes the assembling apparatus 2, the applying apparatus 3, and the soldering apparatus 4. This combination of the system is only an example and another component may be included. For example, another apparatus (for example, a conveyer apparatus) may be further provided between the assembling apparatus 2 and the applying apparatus 3. In this case, one side of the applying apparatus 3 is adjacent to the conveyer apparatus and the other side is adjacent to the soldering apparatus 4. The conveyer apparatus performs predetermined processing on the printed circuit board conveyed from the adjacent assembling apparatus 2 and then conveys the printed circuit board to the applying apparatus 3.

In the above embodiments, the arrangement of the filtering unit 31 of the intake and exhaust unit 30 of the applying apparatus 3 that applies flux has been described. The structure of above embodiments is applicable to another apparatus (that is, an apparatus that performs filtering using a filter) that uses the filtering unit 31.

In addition, a connector is assumed as an example of electronic components in the above embodiments. However, other electronic components used for controlling an electronic circuit, such as a resistor, capacitor, and coil may also be used.

In the above embodiments, a fan is provided in any position in the exhaust pipe 40 to suck the sprayed flux present in the applying apparatus 3 through the intake and exhaust unit 30. However, the fan may be provided in the applying apparatus 3. For example, the fan may be provided in the intake and exhaust unit 30.

While the invention has been shown and described in detail, the foregoing description is in all aspects illustrative and not restrictive. It is therefore understood that numerous other modifications and variations can be devised without departing from the scope of the invention.

What is claimed is:

1. An applying apparatus that applies a flux liquid, the applying apparatus comprising:
a housing that encloses a space;
a nozzle from which the flux liquid is injected, the nozzle located within the space; and
an intake and exhaust unit located within the space and enclosing an internal area that does not include the nozzle, the intake and exhaust unit having (i) an intake port through which a gas that includes the flux liquid that has been injected from the nozzle enters the internal area from the space and (ii) an exhaust port through which a as from which the flux liquid has been filtered exits the internal area, wherein
the intake and exhaust unit includes a filtering unit that filters the flux liquid from the gas that has entered the internal area through the intake port, the filtering unit being located between the intake port and the exhaust port in a gas flow path that extends through the internal area, and
the filtering unit is movably provided within the intake and exhaust unit so that when installing/removing the filtering unit with respect to the intake and exhaust unit, the filtering unit moves in a direction substantially parallel to a direction in which the gas that includes the flux liquid enters the internal area through the intake port and in which the gas that exits the internal area is exhausted through the exhaust port.

2. The applying apparatus according to claim 1, wherein
the internal area of the intake and exhaust unit includes a first chamber through which the gas that includes the flux liquid reaches the filtering unit from the intake port, and a second chamber through which the gas from which the flux liquid has been filtered by the filtering unit reaches the exhaust port, and
a width of the first chamber in a direction orthogonal to the direction in which the filtering unit moves is smaller than a width of the second chamber in the direction orthogonal to the direction in which the filtering unit moves.

3. The applying apparatus according to claim 2, wherein
the first chamber and the second chamber are formed by dividing the internal area of the intake and exhaust unit by an L-shaped compartment section, and
the compartment section includes (i) the filtering unit which extends substantially parallel to the direction in which the gas that includes the flux liquid enters the internal area through the intake port, and (ii) a dividing plate which extends in a direction orthogonal to the direction in which the gas that includes the flux liquid enters the internal area through the intake port.

4. The applying apparatus according to claim 1, further comprising:
an exhaust pipe through which the gas that has passed through the filtering unit is exhausted externally from the applying apparatus, wherein
the exhaust pipe has an extension part extending into the intake and exhaust unit, and
a length of the extension part is smaller than an entire length of the filtering unit and larger than one-half the entire length of the filtering unit.

5. An applying system that applies a flux liquid, the applying system comprising:
the applying apparatus according to claim 1;
a first apparatus provided adjacent to a first side of the applying apparatus; and
a second apparatus provided adjacent to a second side of the applying apparatus, the first and second sides facing in opposite directions.

6. An applying method for applying a flux liquid, the applying method comprising the steps of:
(a) injecting the flux liquid from a nozzle that is located within a housing that encloses a space;
(b) sucking a gas that includes the flux liquid that has been injected from the nozzle into an internal area enclosed by an intake and exhaust unit through an intake port of the intake and exhaust unit, the intake and exhaust unit being located within the space of the housing, the nozzle being located outside of the internal area; and
(c) exhausting a gas from which the flux liquid has been filtered through an exhaust port of the intake and exhaust unit so that the gas from which the flux liquid has been filtered exits the internal area, wherein
the intake and exhaust unit includes a filtering unit that filters the flux liquid from the gas that has entered the internal area through the intake port, the filtering unit being located between the intake port and the exhaust port in a as flow path that extends through the internal area, and
the filtering unit is movably provided within the intake and exhaust unit so that when installing/removing the filtering unit with respect to the intake and exhaust unit, the filtering unit moves in a direction substantially parallel to a direction in which the gas that includes the flux liquid enters the internal area through the intake port and in which the gas that exits the internal area is exhausted through the exhaust port.

7. The applying method according to claim 6, wherein
the internal area of the intake and exhaust unit includes a first chamber through which the gas that includes the flux liquid reaches the filtering unit from the intake port, and a second chamber through which the gas from which the flux liquid has been filtered by the filtering unit reaches the exhaust port, and
a width of the first chamber in a direction orthogonal to the direction in which the filtering unit moves is smaller than a width of the second chamber in the direction in which the filtering unit moves.

8. The applying method according to claim 7, wherein
the first chamber and the second chamber are formed by dividing the internal area of the intake and exhaust unit by an L-shaped compartment section, and
the compartment section includes (i) the filtering unit which extends substantially parallel to the direction in which the gas that includes the flux liquid enters the internal area through the intake port, and (ii) a dividing plate which extends in a direction orthogonal to the direction in which the gas that includes the flux liquid enters the internal area through the intake port.

9. The applying method according to claim 6, further comprising the step of:
(d) exhausting the gas that has passed through the filtering unit externally from the intake and exhaust unit through an exhaust pipe, wherein
the exhaust pipe has an extension part extending into the intake and exhaust unit, and
a length of the extension part is smaller than an entire length of the filtering unit and larger than one-half the entire length of the filtering unit.

* * * * *